United States Patent [19]
Adachi et al.

[11] Patent Number: 5,802,451
[45] Date of Patent: Sep. 1, 1998

[54] NON-LINEAR COMPENSATION CIRCUIT FOR A POWER AMPLIFIER

[75] Inventors: Masaru Adachi, Kodaira; Yukinari Fujiwara, Musashimurayama, both of Japan

[73] Assignee: Hitachi Denshi Kabushiki Kaisha, Tokyo, Japan

[21] Appl. No.: 703,124

[22] Filed: Aug. 26, 1996

[30] Foreign Application Priority Data

Aug. 28, 1995 [JP] Japan ................. 7-218642

[51] Int. Cl.$^6$ ............... H04B 1/38; H04B 1/04
[52] U.S. Cl. ............... 455/126; 330/107
[58] Field of Search ............ 455/126; 330/107; 331/11, 12, 25

[56] References Cited

U.S. PATENT DOCUMENTS

| | | | |
|---|---|---|---|
| 5,483,681 | 1/1996 | Bergsten | 455/126 |
| 5,564,087 | 10/1996 | Cygan | 455/126 |
| 5,574,992 | 11/1996 | Cygan | 455/126 |
| 5,675,286 | 10/1997 | Baker | 455/126 |
| 5,699,383 | 12/1997 | Ichiyoshi | 455/126 |

OTHER PUBLICATIONS

Transmitter Linearization using Catresian Feedback forLinear DTMA Modulation, IEEE Vehicular Technology Conference, 1991, pp. 439–444.

*Primary Examiner*—Howard Britton
*Attorney, Agent, or Firm*—Antonelli, Terry, Stout & Kraus, LLP

[57] ABSTRACT

In a radio communication device which includes at least a modulator, a power amplifier, a demodulator, and a carrier oscillator wherein an input signal to the radio communication device is corrected with a feedback demodulated signal to compensate for possible non-linear distortions in the power amplifier, a phase shift quantity for correction of the phase of the carrier which demodulates the feedback modulated signal in the demodulator is separated into a fixed phase quantity and a variable phase quantity smaller than the fixed phase quantity. The carrier is phase-corrected such that a phase shifter shifts the phase of the carrier by the fixed phase quantity and a second phase shifter shifts the phase of the carrier by the variable phase quantity smaller than the fixed phase quantity.

11 Claims, 4 Drawing Sheets

NON-LINEAR COMPENSATION CIRCUIT FOR A POWER AMPLIFIER

BACKGROUND OF THE INVENTION

The present invention relates to a non-linear compensation circuit which compensates for possible non-linear distortions in a power amplifier, using negative feedback, and more particularly to improvements to a non-linear compensation circuit for a power amplifier in a radio communication device.

Generally, in a digital radio communication device, especially in a mobile communication device, which uses a linear modulation system of a quadrature phase shift keying (QPSK) or multi-level quadrature amplitude modulation (QAM) type, interference to adjacent channels are caused by possible non-linear distortions in the power amplifier on account of conditions deriving from the purposes of the radio communication device. Thus, it is required to compensate for the output of the power amplifier so as to be linear.

FIG. 1 is a circuit block diagram of a transmitter of a quadrature modulation type radio communication device using a non-linear compensation circuit for a conventional power amplifier. The non-linear compensation circuit includes a Cartesian negative-feedback amplifier which provides the amplifier with feedback signals including an in-phase signal and a quadrature signal.

The non-linear compensation circuit using the Cartesian negative-feedback amplifier of FIG. 1 is, for example, disclosed in "Transmitter Linearization using Cartisian Feedback for Linear TDMA Modulation", IEEE Vehicular Technology Conference, 1991, pp. 439–444.

In FIG. 1, reference numerals 1 and 2 each denote a signal input terminal; 3, 4 each a subtracter; 5, 6 each an amplifier; 7, 8 each modulator; 9 a π/2 phase shifter; 10 an adder which adds modulation signals from modulators 7 and 8; 21 a quadrature modulator composed of modulators 7, 8, π/2 phase shifter 9 and the adder 10; 11 a filter which filters out unnecessary signal components; 12 a power amplifier; 13 an antenna; 14 a directional coupler which extracts a feedback signal from the output of power amplifier 12; 15, 16 each a demodulator; 17 a π/2 phase shifter; 22 a quadrature demodulator composed of demodulators 15, 16 and π/2 phase shifter 17; 18 a carrier oscillator (local oscillator); 20 a phase difference detector which detects the phase difference between the input and feedback signals; and 19 a variable phase shifter which shifts the phase of the carrier output from the carrier generator 18 in accordance with the detected output from the phase difference detector 20.

A quadrature component signal Q applied from the signal input terminal 1 is input to the subtracter 3 and the phase difference detector 20. The in-phase component signal I applied from the signal input terminal 2 is input to the subtracter 4 and the phase difference detector 20.

A feedback quadrature component signal Qr input to the subtracter 3 is subtracted from the quadrature component signal input separately to the subtracter 3 to become a quadrature component signal whose possible distortions are corrected with the feedback signal. The corrected quadrature component signal is then delivered to the amplifier 5 where this signal is amplified to a required level and output then to the modulator 7 of the quadrature modulator 21.

A feedback in-phase component signal Ir input to the subtracter 4 is subtracted from the in-phase component signal input separately to the subtracter 4 to become an in-phase component signal whose possible distortions are corrected with the feedback signal. The corrected in-phase component signal is then delivered to the amplifier 6 where this signal is amplified to a required level and then output to the modulator 8 of the quadrature modulator 21.

The carrier oscillator 18 generates an oscillating carrier (local oscillation signal) having a required frequency, which is output to the modulator 8 of the quadrature modulator 21, the π/2 phase shifter 9 and the variable phase shifter 19. The carrier input to the phase shifter 9 is phase-shifted by π/2 and the resulting signal is output to the modulator 7 of the quadrature modulator 21.

The carrier input to the variable phase shifter 19 is output to the demodulator 16 of the quadrature demodulator 22, and π/2 phase shifter 17 and thence phase-shifted by π/2 and the resulting signal is output to the demodulator 15 of the quadrature demodulator 22.

The required level distortion-corrected quadrature component signal input to the modulator 7 modulates the carrier having the required frequency shifted by π/2 in the phase shifter 9.

The modulator 7 outputs the carrier or modulation signal modulated with the quadrature component signal to the adder 10. The required level distortion-corrected in-phase component signal input to the modulator 8 modulates the carrier having the required frequency input to the modulator 8. The modulator 8 outputs the carrier or modulation signal modulated with the in-phase component signal to the adder 10.

The modulation signals modulated with the quadrature and in-phase component signals are added in the adder 10 and output as a distortion-corrected quadrature modulation signal to the filter 11, where possible unnecessary components are filtered out from the quadrature modulation signal and the resulting signal is then output to and amplified to a required power by the power amplifier 12. Thus, the distortion-corrected quadrature modulation signal and non-linear distortions in the power amplifier 12 are canceled and the difference is compensated for. Thus, a distortion-free quadrature modulation signal is transmitted from the antenna 13.

Part of the transmission output amplified to the required power by the power amplifier 12 is extracted by the directional coupler 14 and fed back to the demodulators 15, 16 of the quadrature demodulator 22. The quadrature modulation signal fed back to the demodulator 15 demodulates the feedback quadrature component signal Qr by the carrier which has the predetermined frequency and is input separately to the demodulator 15 and phase-shifted by π/2 by the π/2 phase shifter 17.

The demodulator 15 outputs the demodulated feedback quadrature component signal to the subtracter 3 and the phase difference detector 20.

The quadrature modulation signal fed back to the demodulator 16 demodulates the feedback in-phase component signal Ir by the carrier having the required frequency input separately to the demodulator 16. The demodulator 16 outputs the demodulated feedback in-phase component signal to the subtracter 4 and the phase difference detector 20.

The carrier used in the quadrature demodulator 22 for demodulating purposes is input from the variable phase shifter 19 to the demodulator 22. The variable phase shifter 19 is controlled so as to output a carrier having a phase to correct the phase difference Θ occurring between the quadrature modulation signal and the feedback quadrature modulation signal.

The control of the variable phase shifter 19 is performed by the output signal from the phase difference detector 20. The phase difference detector 20 detects a phase difference Θ due to a delay time, etc., occurring in the filter 11, power amplifier 12, directional coupler 14, etc., between the quadrature modulator 21 and the quadrature demodulator 22 by comparing the input quadrature component signal Q and the feedback quadrature component signal Qr with reference to phase, and comparing the in-phase component signal I and the feedback in-phase component signal Ir with reference to phase, and then corrects the phase differences such that correct feedback is provided from the quadrature demodulator 22 to the subtracters 3 and 4.

FIGS. 2 and 3 each illustrate an example of a conventional variable phase shifter 19. The variable phase shifter of FIG. 2 is composed of a plurality of cascaded phase shifters 60. Each phase shifter 60 includes a π-type phase shifter composed of a capacitor 52 and a variable capacitance diode 54 connected in series with the capacitor, an inductance 51, and a capacitor 53. The output of a digital-to-analog (D/A) converter 55 which provides a voltage to change the capacity of the variable capacitance diode 54 is connected to the conjunction point of the capacitor 52 and the variable capacitance diode 54.

The variable phase shifter 19 of FIG. 2 changes correction phase information input to the respective D/A converters 55 of the phase shifters 60 to change the output voltages from the respective D/A converters 55, and the terminal voltages and hence capacities of the variable capacitance diodes 54 to thereby change a quantity of phase shift of the carrier output from the carrier oscillator 18.

The variable phase shifter of FIG. 3 includes a quadrature modulator 74. That is, the phase shifter is composed of a sine/cosine ROM 71, a pair of D/A converters 72, 73 and the quadrature modulator 74.

The variable phase shifter of FIG. 3 changes the sine Θ/cos Θ data output from the sine/cosine ROM 71 in accordance with correction phase information input to the sin/cos ROM 71, converts those data to analog signals by D/A converters 72, 73, inputs the resulting signals to the quadrature modulator 74, and phase-modulates the carrier oscillator output signal (carrier) input separately to the quadrature modulator 74 to thereby shift the phase of the carrier by Θ.

SUMMARY OF THE INVENTION

In the non-linear compensation circuit for the conventional power amplifier, the variable phase shifter is required to have a wide phase variable range to cope with uneven delay times and changes of characteristics due to temperature changes on the like, in the filters which filter out unnecessary components from the quadrature modulation signal and the power amplifier which amplifies the input signal to the required power.

Especially, since the oscillation frequency of the carrier oscillator of the radio communication device is high and has a period short compared to fluctuations of the delay times or the like, a variable phase range of 2π corresponding to one period is required so as to correct the phase. Thus, a phase shifter which is capable of changing the phase through a wide range is required.

When the variable phase shifter of FIG. 2 is used, a range of phase which changes linearly with respect to voltage in one phase shifter is small. Thus, phase control is difficult. Further, since the variable phase range of the variable phase shifter is small, many variable phase shifters are required to be connected in cascade, resulting in the increase of the circuit scale.

Although the variable phase shifter using the quadrature modulator of FIG. 3 is capable of changing the phase linearly through a range of 2π, quantity of data required for the phase correction increases correspondingly and hence the capacity of a ROM concerned increases.

It is therefore an object of the present invention to provide a non-linear compensation circuit for a power amplifier which solves the problems with the prior art and to reduce the whole circuit scale of the variable phase shifter.

In order to achieve the above object, according to one aspect of the present invention, there is provided a non-linear compensation circuit for an amplifier, which includes: a carrier oscillator for generating and outputting an oscillating carrier having a predetermined frequency; correction means for correcting an input signal to the circuit and for outputting the corrected signal; a modulator for modulating the corrected signal with the carrier from the carrier oscillator to output a modulated signal; an amplifier for amplifying and outputting the modulated signal from the modulator; a feedback passageway for extracting part of the modulated signal output from the amplifier as a feedback modulation signal; a phase shifter for shifting the phase of the carrier from the carrier oscillator and for outputting the resulting signal; a demodulator for demodulating the feedback modulated signal from the feedback passageway with the phase-shifted carrier from the phase shifter and outputting a feedback demodulated signal; a phase difference detector (1) for detecting a possible phase difference between the input signal and the feedback demodulated signal, (2) for separating the phase difference into a fixed phase quantity and a variable phase quantity smaller than the fixed phase quantity, and (3) for outputting a signal indicative of the fixed phase quantity and a signal indicative of the variable phase quantity to the phase shifter; the correction means correcting the input signal with the feedback demodulated signal, and for outputting the corrected signal; the phase shifter shifting the phase of the carrier from the carrier oscillator by the fixed phase quantity depending on a signal indicative of the fixed phase quantity and for shifting the phase of the carrier from the carried wave oscillator by the variable phase quantity depending on a signal indicative of the variable phase quantity.

Preferably, the fixed phase quantity of the phase difference detected by the phase difference detector is $n\pi/2$ where n is 0, 1, 2 or 3 and the variable phase quantity Φ of the phase difference is in a range of $0 \leq \Phi < \pi/2$.

Preferably, the phase shifter includes a first and a second phase shifter. The first phase shifter shifts the phase of the carrier from the carrier oscillator by the variable phase quantity in accordance with a signal indicative of the variable phase quantity. The second phase shifter shifts the demodulated signal from the demodulator by the fixed phase quantity in accordance with a signal indicative of the fixed phase quantity.

The second phase shifter selectively inverts the demodulated signal from the demodulator in accordance with the signal indicative of the fixed phase quantity.

That is, in the invention, the quantity of phase shift for correction of the phase of the carrier which demodulates the feedback modulated signal in the demodulator is divided into the fixed phase quantity and the variable phase quantity smaller than the fixed phase quantity. The phase shifter for phase correction includes a phase shifter which shifts the fixed phase quantity of $n\pi/2$ (n=0, 1, 2 or 3) and a phase shifter which shifts the variable phase quantity Φ ($0 \leq \Phi < \pi/2$) smaller than the fixed phase quantity. Thus, the phase shifter which shifts by the fixed phase quantity of $n\pi/2$ (n=0, 1, 2 or 3) has a simple structure which selectively outputs a combination of a feedback demodulated signal and the inverted feedback demodulated signal. The phase shifter which shifts the variable phase quantity of $\Phi$ ($0 \leq \Phi < \pi/2$) smaller than the fixed phase quantity shifts a phase quantity not more than ¼ of the conventional phase shift quantity to thereby simplify the whole structure of the phase shifter and to render the phase shifter inexpensive and small-sized.

DESCRIPTION OF THE PREFERRED EMBODIMENTS

The basic principles of phase correction in the present invention will be described. A phase angle θ of a quadrature demodulation signal to be corrected is given by $$\theta = n\pi/2 + \Phi \quad (1)$$

The phase angle e can be divided into $n\pi/2$ (n=0, 1, 2, 3) which is a larger angle to be handled easily, and the remaining smaller angle $\Phi (0 \leq \Phi < \pi)$.

When the quadrature demodulation signal R is handled as a complex signal $R_{DEM} = I_{DEM} + j Q_{DEM}$, where I and Q each is a real part and j is a complex symbol, the correction to the phase is then represented by $$R_{DEM} \cdot exp(j\theta) \quad (2)$$

where $$exp(j\theta) = exp(jn\pi/2 + j\Phi) \quad (3)$$
$$= exp(jn\pi/2) \cdot exp(j\Phi)$$

Where, $exp(jn\pi/2)$ and $exp(j\Phi)$ are handled as terms A and B, respectively.

Assume that the variable phase shifter corrects the phase of the term B whose angle is smaller. The remaining correction relates to the term A whose angle is divided sharply and easy to handle. In the term A, n=0, 1, 2 or 3. Thus, the term A becomes 1, j, −1 or −j depending on the value of n and the phase-corrected outputs Ir and Qr take values of Table 1 below:

TABLE 1

| n | exp(jnπ/2) | Ir | Qr |
|---|---|---|---|
| 0 | 1 | $I_{DEM}$ | $Q_{DEM}$ |
| 1 | j | $-Q_{DEM}$ | $I_{DEM}$ |
| 2 | −1 | $-I_{DEM}$ | $Q_{DEM}$ |
| 3 | −j | $Q_{DEM}$ | $-I_{DEM}$ |

It is seen from Table 1 that a quantity of phase $n\pi/2$ (n=0, 1, 2 or 3) can be corrected only by inverting the input signal to the variable phase shifter or replacing the in-phase and quadrature components of the input signal with each other.

Figure 1:
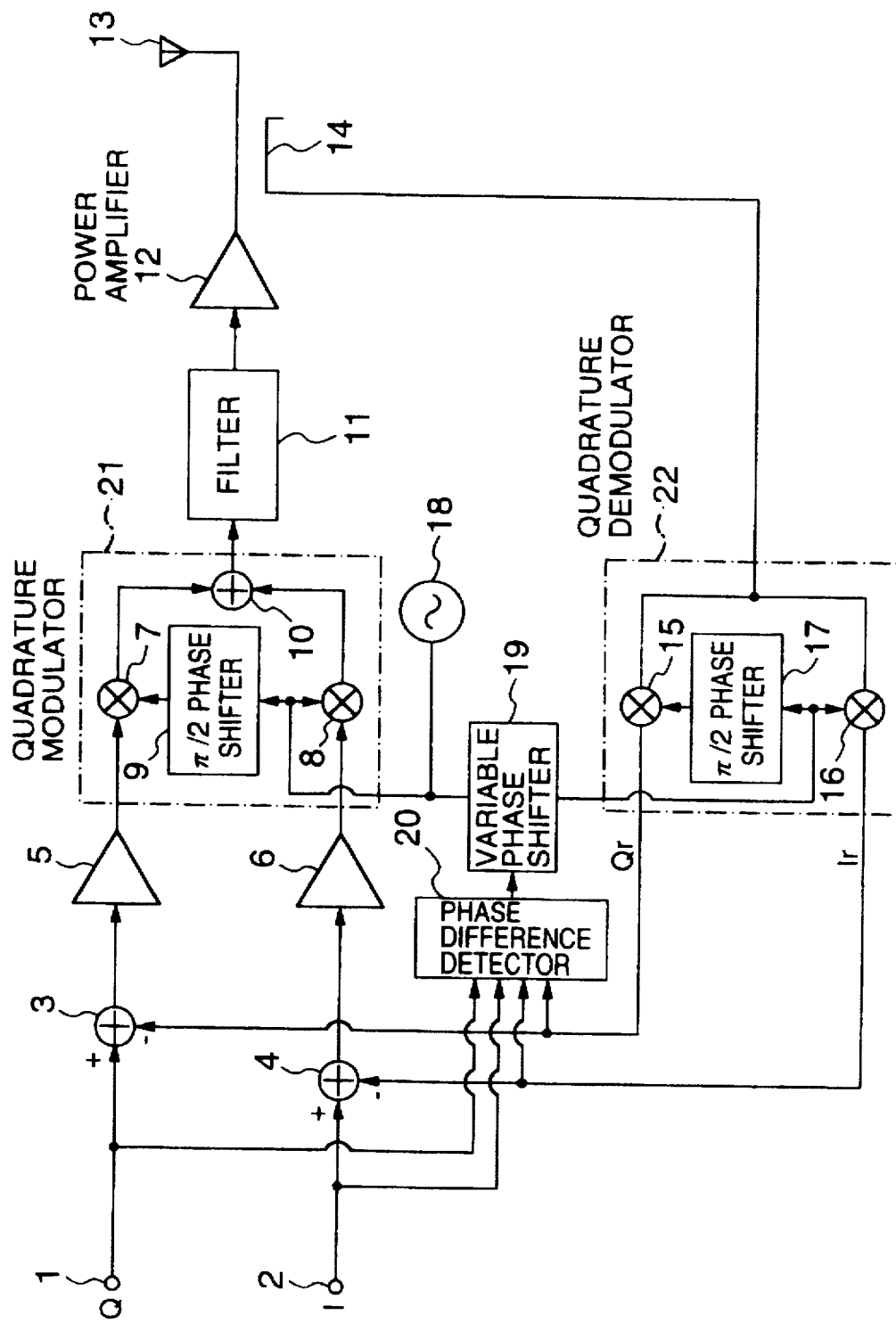
FIG. 1 is a block diagram indicative of a circuit structure of one example of a transmitter of a radio communication device using a non-linear compensation circuit for the conventional power amplifier.
Figure 4:
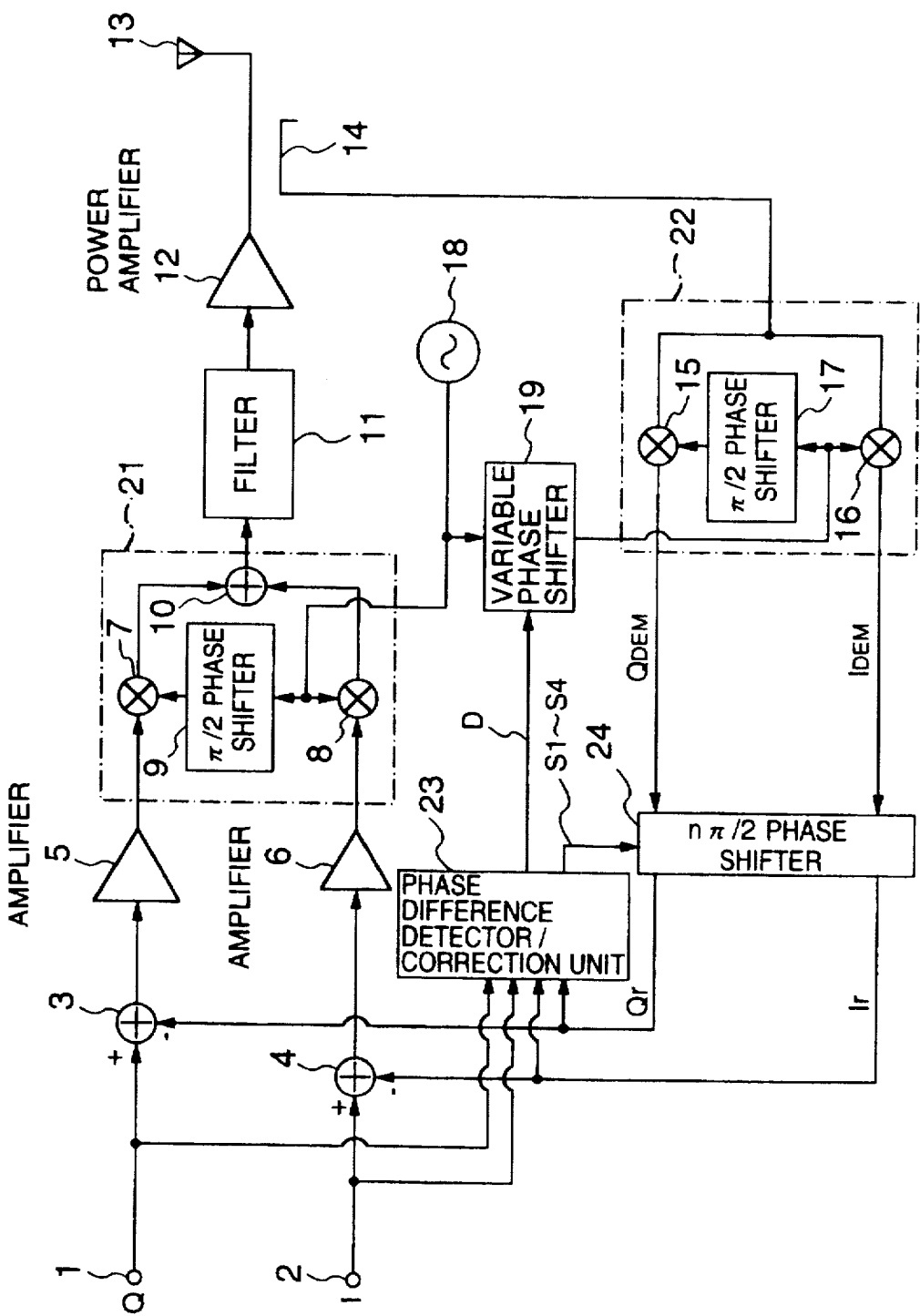
FIG. 4 is a block diagram indicative of a circuit structure of a transmitter of a radio communication device using a non-linear compensation circuit for a power amplifier as one embodiment of the present invention.
Figure 5:
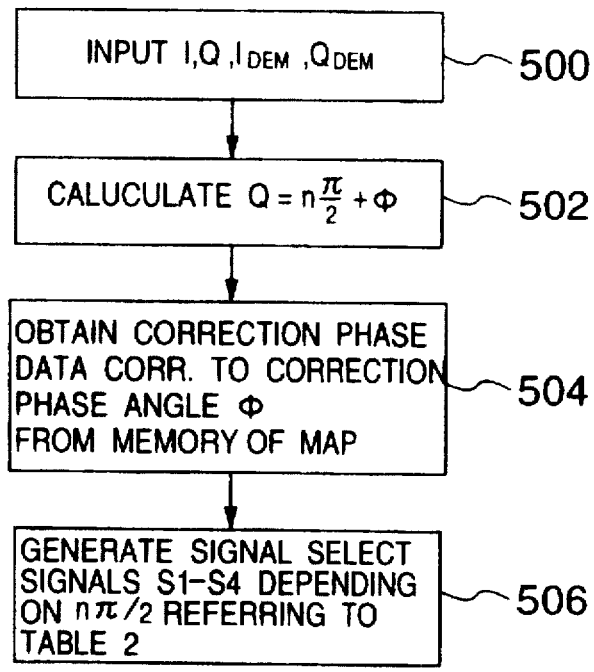
FIG. 5 is a flow chart indicative of the operation of one example of a phase difference detection/correction unit of FIG. 4.
Figure 6:
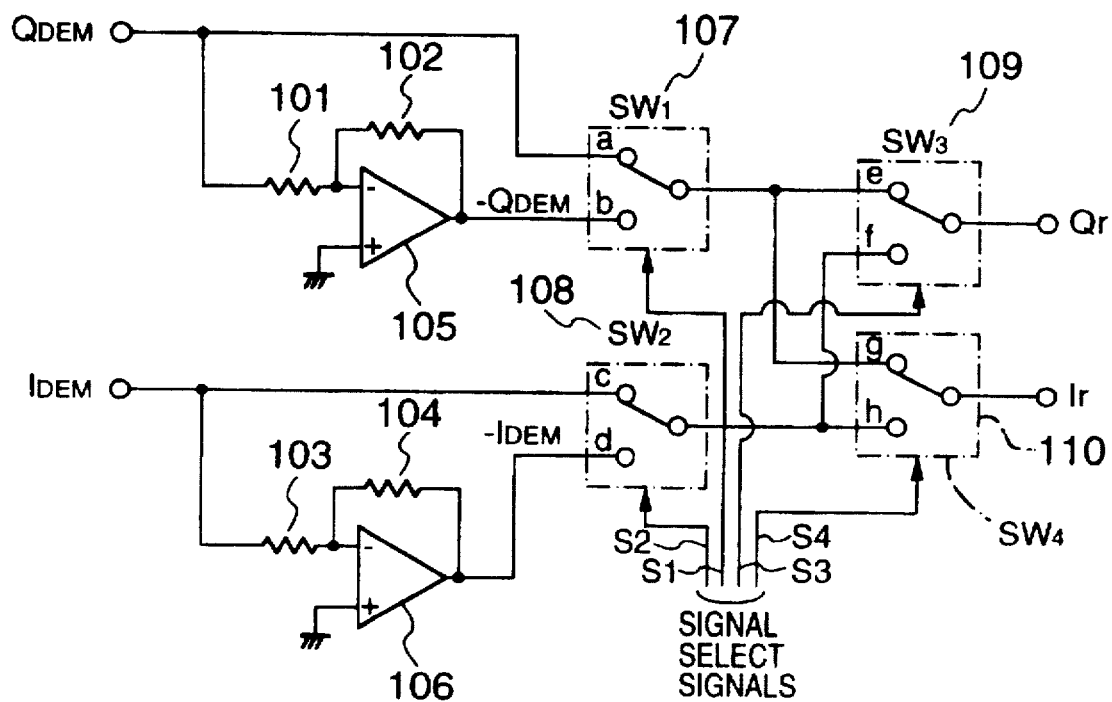
FIG. 6 is a block diagram indicative of the circuit structure of one example of a $n\pi/2$ phase shifter of FIG. 1.

The embodiment of the present invention will be described with reference to FIGS. 4–6. FIG. 4 is a circuit block diagram indicative of a transmitter of a quadrature modulation radio communication device using a non-linear compensation circuit of the present invention. In FIGS. 4 to 6, the same reference numerals as those of FIG. 1 denote elements having the same function as those of FIG. 1.

In FIG. 4, reference numeral 1 denotes a quadrature component signal input terminal; 2 an in-phase component signal input terminal; 3 a subtracter which subtracts a feedback quadrature component signal from the input quadrature component signal; 4 a subtracter which subtracts a feedback in-phase component signal from the input in-phase component signal; 5 an amplifier which amplifies the subtracted quadrature component signal; 6 an amplifier which amplifies the subtracted in-phase component signal; 7 a modulator which modulates the carrier with the quadrature component signal; 8 a modulator which modulates the carrier with the in-phase component signal; 9 a π/2 phase shifter which shifts the phase of the carrier by π/2; 10 an adder which adds modulation signals from the modulators 7 and 8; 21 an quadrature modulator composed of modulators 7, 8, π/2 phase shifter 9 and adder 10; 11 a filter which filters out unnecessary components of the quadrature modulation signal; 12 a power amplifier which amplifies the quadrature modulation signal to a required power level; 13 an antenna; 14 a directional coupler which extracts a feedback signal from the output of the power amplifier 12; 15 a demodulator which demodulates a quadrature component signal from the feedback quadrature modulation signal; 16 a demodulator which demodulates a in-phase component signal from the feedback in-phase modulation signal; 17 a π/2 phase shifter which shifts the phase of the carrier by π/2; 22 a quadrature demodulator composed of demodulators 15, 16 and π/2 phase shifter 17; 18 a carrier (local) oscillator; 23 a phase difference detection/correction unit which detects the phase difference between the input signal and the feedback signal and outputs correction data and signal select signals; 19 a variable phase shifter which shifts the phase of the carrier output from the carrier oscillator 18 by an angle $\Phi$ in a small range ($0 \leq \Phi < \pi/2$) depending on the correction data from the phase difference detection/correction unit 23; 24 an $n\pi/2$ phase shifter which selectively shifts the phases of the demodulated quadrature and in-phase component signals output from the quadrature demodulator 22 by a predetermined angle ($n\pi/2$) in accordance with the signal selection signals from the phase difference detection/correction unit 23.

The quadrature component signal Q applied at the quadrature component signal input terminal 1 is input to the subtracter 3 and the phase difference detection/correction unit 23. The in-phase component signal I applied at the in-phase component signal input terminal 2 is input to the subtracter 4 and the phase difference detection/correction unit 23.

The feedback quadrature component signal Qr input to the subtracter 3 is subtracted from the quadrature component signal Q separately input to the subtracter 3 such that the output from the subtracter 3 becomes a corrected quadrature component signal from which possible distortions in the power amplifier 12 have been corrected by the feedback signal. The corrected quadrature component signal is output to the amplifier 5 which amplifies that signal to a required level and the resulting signal is output to the modulator 7 of the quadrature modulator 21.

The feedback in-phase component signal Ir input to the subtracter 4 is subtracted from the in-phase component signal I separately input to the subtracter 4 such that the output from the subtracter 4 becomes a corrected in-phase component signal from which possible distortions in the power amplifier 12 have been corrected by the feedback signal. The corrected in-phase component signal is output to the amplifier 6 which amplifies that signal to a required level and the resulting signal is output to the modulator 8 of the quadrature modulator 21.

The carrier oscillator 18 generates an oscillating carrier having a required frequency which is output to the modulator 8, the π/2 phase shifter 9 of the quadrature modulator 21 and the variable phase shifter 19. The carrier input to the π/2 phase shifter 9 is shifted by π/2 in phase, and the resulting signal is output to the modulator 7 of the quadrature modulator 21.

The carrier input to the variable phase shifter 19 is shifted by an angle depending on correction data D from the correction unit 23 and the resulting signal is output to the demodulator 16 and the π/2 phase shifter 17 of the quadrature demodulator 22. The carrier input to the π/2 phase shifter 17 is shifted by π/2 in phase and the resulting signal is output to the demodulator 15 of the quadrature demodulator 22.

The distortion-corrected quadrature component signal having the required level input to the modulator 7 modulates the carrier having the required frequency input separately to the modulator 7 and shifted by π/2 by the π/2 phase shifter 9. The modulator 7 outputs a modulation signal based on the corrected quadrature component signal to the adder 10.

The distortion-corrected in-phase component signal having the required level input to the modulator 8 modulates the carrier having the predetermined frequency input separately to the modulator 8. The modulator 8 outputs a modulation signal based on the corrected inphase component signal to the adder 10.

The modulated signals based on the corrected quadrature and corrected in-phase component signals are added in the adder 10 and output as a distortion-corrected quadrature modulation signal to the filter 11 which filters out unnecessary components from the input quadrature modulation signal and outputs the resulting signal to the power amplifier 12. The amplifier 12 amplifies this signal to a required power. Thus, the corrected quadrature modulation signal cancels non-linear distortions in the power amplifier 12, and hence a distortion-free quadrature modulation signal is transmitted from the antenna 13.

Part of the transmission output amplified to the required power by the power amplifier 12 is extracted in the directional coupler 14 and input as a feedback quadrature modulation signal to demodulators 15, 16 of the quadrature demodulator 22.

The feedback quadrature modulation signal input to the demodulator 15 demodulates a feedback quadrature component signal $Q_{DEM}$ with the carrier having the predetermined frequency which was shifted by the variable phase shifter 19 and π/2-shifted by the π/2 phase shifter 17. The demodulator 15 outputs the demodulated feedback quadrature component signal $Q_{DEM}$ to the nπ/2 phase shifter 24.

The feedback quadrature modulation signal input to the demodulator 16 demodulates a feedback inphase component signal $I_{DEM}$ with the carrier having the required frequency input separately to the demodulator 16 and shifted by the variable phase shifter 19. The demodulator 16 outputs the demodulated feedback in-phase component signal $I_{DEM}$ to the nπ/2 phase shifter 24.

The feedback quadrature and feedback in-phase component signals $Q_{DEM}$ and $I_{DEM}$ are not completely phase-corrected because the carrier is phase-corrected by a small angle in the variable phase shifter 19.

The feedback quadrature and in-phase component signals $Q_{DEM}$ and $I_{DEM}$ input to the nπ/2 phase shifter 24 are shifted by a larger angle of nπ/2 in accordance with the signal select signals input separately to the phase shifter 24, so that completely phase-corrected feedback quadrature and in-phase component signals Qr and Ir are then output to the subtracters 3 and 4, respectively, and also to the phase difference detection/correction unit 23.

The variable phase shifter 19, which supplies the carrier to be used in the quadrature demodulator 22 for demodulating purposes, is controlled so as to correct a smaller one Φ of phase differences Θ occurring between the quadrature modulation signal and the feedback quadrature modulation signal.

This control of the variable phase shifter 19 is performed by correction data D from the phase difference detection/correction unit 23. The phase difference detection/correction unit 23 detects the phase difference Θ due to a delay time, etc., occurring in the filter 11, power amplifier 12, directional coupler 14, etc., between the quadrature modulator 21 and the quadrature demodulator 22 on the basis of the input quadrature and in-phase component signals Q and Ir and the feedback quadrature and in-phase component signals I and Ir and corrects the phase of the feedback quadrature modulation signal such that the feedback quadrature and in-phase component signals having respective correct phases are fed back from the quadrature demodulator 22 to the subtracters 3 and 4.

The phase difference detection/correction unit 23 detects a phase angle Θ to be corrected, produces the correction phase data D for the phase angle Φ obtained by minusing nπ/2 from Θ and produces the signal select signals S1–S4 to the nπ/2 phase shifter 24, and output the correction data D to the variable phase shifter 19 and the signal select signals S1–S4 to the nπ/2 phase shifter 24.

The phase detection/correction unit 23 may be composed, for example, of a microcomputer and the operation of the unit 23 will be described with reference to the flow chart of FIG. 5. The operation of the microcomputer of FIG. 5 is supposed to be performed at predetermined intervals of time, for example.

First, at step 500, the input quadrature component signal Q, and in-phase component signal I from the signal input terminals 1 and the feedback quadrature component signal Qr and feedback in-phase component signal Ir from the quadrature demodulator 22 are input to the phase difference detection/correction unit 23. At step 502 the input quadrature component signal Q is phase-compared with the feedback quadrature component signal Qr, and the input in-phase component signal I is phase-compared with the feedback in-phase component signal Ir to calculate the phase angle Θ=nπ/2+Φ, by using the known technique.

At step 504, correction phase date D corresponding to the correction phase angle Φ obtained at step 502 is calculated.

Figure 2:
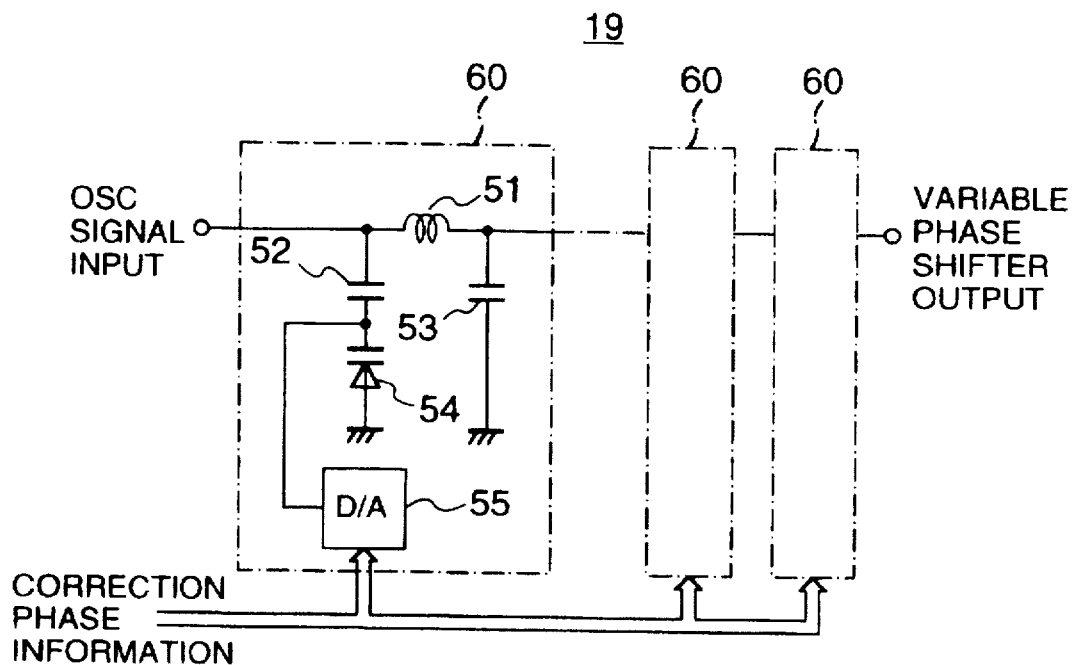
FIG. 2 is a block diagram indicative of the circuit structure of one example of a variable phase shifter of FIG. 1.
Figure 3:
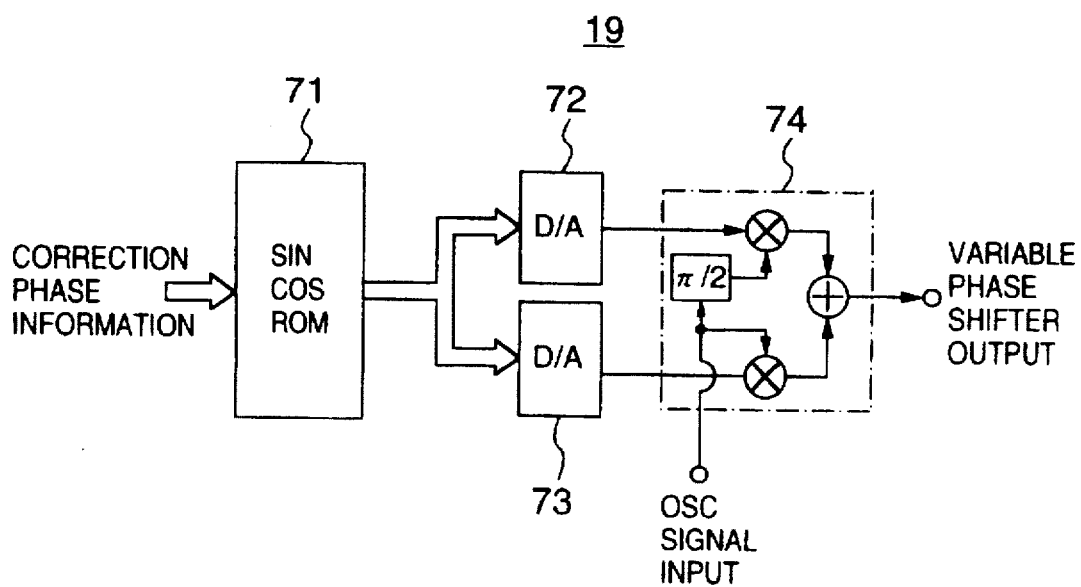
FIG. 3 is a block diagram indicative of the circuit structure of another example of the variable phase shifter of FIG. 1.

In this case, the variable phase shifter 19 of FIG. 2 or 3 is used as such. In the present embodiment, the phase difference detection/correction unit 23 includes, for example, a memory or a map which contains correction phase data D corresponding to the respective values of the correction phase angles Φ. Thus, the correction phase data D corresponding to the correction phase angle Φ obtained at step 502 is obtained referring to the memory or map and output to the variable phase shifter 19.

At step 506, the signal select signals S1–S4 to be supplied to the nπ/2 phase shifter 24 are produced by referring to the information of Table 2 to be described later on the basis of the correction phase angle nπ/2 obtained at step 502.

FIG. 6 is a specified circuit diagram indicative of one example of the nπ/2 phase shifter 24. The feedback quadrature component signal $Q_{DEM}$ from the demodulator 15 is input to a terminal a of a switch 107 (SW1), and an inverting amplifier composed of resisters 101, 102 and an operational amplifier 105, and the inverting amplifier outputs an inverted feedback quadrature component signal($-Q_{DEM}$) to a terminal b of the switch 108.

Similarly, the feedback in-phase component signal $I_{DEM}$ from the demodulator 16 is input to a terminal c of the switch 108 (SW2), and an inverting amplifier composed of resisters 103, 104 and an operational amplifier 106, and the inverting amplifier outputs an inverted feedback in-phase component signal($-I_{DEM}$) to a terminal d of the switch 108.

The select output of the switch 107 is supplied to a terminal e of a switch 109 (SW3)and a terminal g of a switch 110 (SW4), while the select output of the switch 108 is supplied to terminals f and h of the switches 109 and 110, respectively.

The larger angle phase of nπ/2 is corrected by selecting the respective contacts of the switches of the nπ/2 phase shifter 24, as shown in Table 2 below, in accordance with the signal select signals S1–S4 output from the phase difference detection/correction unit 23 and corresponding to the correction phase angle of nπ/2.

TABLE 2

| correction phase angle | switch terminals | | | | output | |
|---|---|---|---|---|---|---|
| | SW1 | SW2 | SW3 | SW4 | Ir | Qr |
| 0 | a | c | e | h | $I_{DEM}$ | $Q_{DEM}$ |
| π/2 | b | c | f | g | $-Q_{DEM}$ | $I_{DEM}$ |
| π | b | d | e | h | $-I_{DEM}$ | $-Q_{DEM}$ |
| 3π/2 | a | d | f | g | $Q_{DEM}$ | $-I_{DEM}$ |

The phase difference detection/correction unit 23 delivers the signal select signals S1, S2, S3, S4 corresponding to the correction phase angle of nn/2 obtained at step 502 of FIG. 5 to the switches 107, 108, 109, 110, respectively, to control same. More specifically, when the obtained correction phase angle of nπ/2 is 0, the phase difference detection/correction unit 23 outputs the signal select signals S1, S2, S3, S4 which connect the switches 107, 108, 109, 110 to the terminals a, c, e, h, respectively. When the obtained correction phase angle of nπ/2 is π/2, the phase difference detection/ correction unit 23 outputs the signal select signals S1, S2, S3, S4 which connect the switches 107, 108, 109, 110 to the terminals b, c, f, g, respectively. When the obtained correction phase angle of nπ/2 is π, the phase difference detection/ correction unit 23 outputs the signal select signals S1, S2, S3, S4 which connect the switches 107, 108, 109, 110 to the terminals b, d, e, h, respectively. When the obtained correction phase angle of nπ/2 is 3π/2, the phase difference detection/correction unit 23 outputs signal select signals S1, S2, S3, S4 which connect the switches 107, 108, 109, 110 to the terminals a, d, f, g, respectively.

The signals S1–S4 each is a binary (high or low level) signal. When the signals S1–S4 are high level, the switches SW1–SW4 may be connected to the terminals a, c, e, g, respectively. When the signals S1–S4 are low level, the switches SW1–SW4 may be connected to terminals b, c, f, h, respectively.

The information of the relation between the correction phase angle and the switch terminals shown in the table 2 may be stored in the unit 23 in advance.

While in the above description the method in which inverted output signals are obtained and the signals are replaced and selected has been illustrated, the signals may first be replaced and then inverted/selected.

As described above, according to the present invention, a non-linear compensation circuit for the power amplifier is provided in which the correction phase angle θ is separated into a larger angle of nπ/2 and the remaining smaller angle Φ, correction of a phase angle of nπ/2 is made by replacing and inverting the signals and correction of the remaining phase Φ smaller than π/2 is made in the variable phase shifter, such that the circuit scale of the variable phase shifter which adjusts the phases of the feedback component signals is reduced.

What is claimed is:

1. A non-linear compensation circuit for an amplifier, comprising:

a carrier oscillator for generating and outputting an oscillating carrier having a predetermined frequency;

correction means for correcting an input signal input to the circuit and for outputting a corrected input signal;

a modulator for modulating the corrected input signal with the carrier from said carrier oscillator to output a modulated signal;

an amplifier for amplifying and outputting the modulated signal from said modulator;

a feedback path for extracting a part of the modulated signal output from said amplifier as a feedback modulated signal;

a phase shifter for shifting a phase of the carrier from said carrier oscillator and for outputting a phase-shifted carrier;

a demodulator for demodulating the feedback modulated signal from said feedback path with the phase-shifted carrier from said phase shifter and for outputting a feedback demodulated signal; and a phase difference detector for detecting a phase difference between the input signal and the feedback demodulated signal, for separating the phase difference into a fixed phase quantity and a variable phase quantity smaller than the fixed phase quantity, and for outputting a signal indicative of the fixed phase quantity and a signal indicative of the variable phase quantity to said phase shifter, wherein said correction means corrects the input signal in accordance with the feedback demodulated signal and outputs the corrected input signal, and wherein said phase shifter shifts a phase of the carrier from said carrier oscillator by the fixed phase quantity depending on the signal indicative of the fixed phase quantity and for shifting a phase of the carrier from the carrier oscillator by the variable phase quantity depending on the signal indicative of the variable phase quantity.

2. A non-linear circuit of an amplifier according to claim 1, wherein the fixed phase quantity of the phase difference detected by said phase difference detector is nπ/2, where n is 0, 1, 2 or 3 and the variable phase quantity Φ of the phase difference is in a rarge of 0≦Φ<π/2.

3. A non-linear compensation circuit for an amplifier, comprising:

a carrier oscillator for generating and outputting an oscillating carrier having a predetermined frequency;

correction means for correcting an input signal input to the circuit and for outputting a corrected input signal;

a modulator for modulating the corrected input signal with a carrier from said carrier oscillator to output a modulated signal;

an amplifier for amplifying and outputting the modulated signal from said modulator;

a feedback path for extracting a part of the modulated signal from said amplifier as a feedback modulated signal;

a first phase shifter for shifting a phase of the carrier from said carrier oscillator and for outputting a phase-shifted carrier;

a demodulator for demodulating the feedback modulated signal from said feedback path with the phase-shifted carrier from said phase shifter and for outputting a demodulated signal;

a second phase shifter for shifting a phase of the demodulated signal from said demodulator and for outputting the demodulated signal thus phase-shifted as a feedback demodulated signal; and a phase difference detector for detecting a possible phase difference between the input signal and the feedback demodulated signal, for separating the phase difference into a fixed phase quantity and a variable phase quantity smaller than the fixed phase quantity, and for outputting a signal indicative of the fixed phase quantity and a signal indicative of the variable phase quantity to said second and first phase shifters, respectively, wherein said correction means corrects the input signal in accordance with the feedback demodulated signal, and for outputting the corrected input signal, and wherein said first phase shifter shifts a phase of the carrier from said carrier oscillator by the variable phase quantity depending on the signal indicative of the variable phase quantity and said second phase shifter shifts a phase of the demodulated signal from said demodulator by the fixed phase quantity depending on the signal indicative of the fixed phase quantity.

4. A non-linear circuit of an amplifier according to claim 3, wherein the fixed phase quantity of the phase difference detected by said phase difference detector is nπ/2, where n is 0, 1, 2 or 3 and the variable phase quantity Φ of the phase difference is in a rarge of 0≦Φ<π/2.

5. A non-linear compensation circuit for an amplifier according to claim 3, wherein said second phase shifter selectively inverts the demodulated signal from said demodulator in accordance with the signal indicative of the fixed phase quantity.

6. A transmitter of a radio transmission device having a non-linear compensation circuit for a power amplifier, comprising:

a carrier oscillator for generating and outputting an oscillating carrier having a predetermined frequency;

correction means for correcting an input signal input to the circuit and for outputting a corrected input signal;

a modulator for modulating the corrected input signal with a carrier from said carrier oscillator to output a modulated signal;

a power amplifier for amplifying and outputting the modulated signal from said modulator;

an antenna for transmitting the modulated signal from said power amplifier;

a feedback path for extracting a part of the modulated signal from said amplifier as a feedback modulated signal;

a first phase shifter for shifting a phase of the carrier from said carrier oscillator and for outputting a phase-shifted carrier;

a demodulator for demodulating a feedback modulated signal from said feedback path with the phase-shifted carrier from said first phase shifter and for outputting a demodulated signal;

a second phase shifter for shifting a phase of the demodulated signal from said demodulator and for outputting the demodulated signal thus phase-shifted as a feedback phase-shifted demodulated signal; and a phase difference detector for detecting a possible phase difference between the input signal and the feedback phase-shifted signal, for separating the phase difference into a fixed phase quantity and a variable phase quantity smaller than the fixed phase quantity, and for outputting a signal indicative of the fixed phase quantity to said second phase shifter and a signal indicative of the variable phase quantity to said first phase shifter, wherein said correction means corrects the input signal in accordance with the feedback demodulated signal, and for outputting the corrected input signal, and wherein said first phase shifter shifts a phase of the carrier from said carrier oscillator by the variable phase quantity depending on the signal indicative of the variable phase quantity and said second phase shifter shifts a phase of the demodulated signal from said demodulator by the fixed phase quantity depending on the signal indicative of the fixed phase quantity.

7. A transmitter of a radio device according to claim 6, wherein the fixed phase quantity of the phase difference detected by said phase difference detector is nπ/2, where n is 0, 1, 2 or 3, and the variable phase quantity Φ of the phase difference is in a rarge of 0≦Φ<π/2.

8. A transmitter of a radio device according to claim 7, wherein said second phase shifter selectively inverts the demodulated signal from said demodulator in accordance with the signal indicative of the fixed phase quantity.

9. A non-linear compensation circuit for an amplifier, comprising:

a carrier oscillator for generating and outputting an oscillating carrier having a predetermined frequency;

first correction means for correcting an input quadrature component signal input to the circuit and for outputting a corrected quadrature component signal;

second correction means for correcting an input in-phase component signal input to the circuit and for outputting a corrected in-phase component signal;

an quadrature modulator for modulating the corrected quadrature and in-phase component signals with a carrier from said carrier oscillator to output a modulated signal;

an amplifier for amplifying the modulated signal from said modulator and for outputting an amplified modulated signal;

a feedback path for extracting a part of the amplified modulated signal output from said amplifier as a feedback modulated signal;

a first phase shifter for shifting a phase of the carrier from said carrier oscillator and for outputting a phase-shifted carrier;

an quadrature demodulator for demodulating the feedback modulated signal from said feedback path with the phase-shifted carrier from said phase shifter and outputting a demodulated quadrature and a demodulated in-phase component signal;

a second phase shifter for shifting phases of the demodulated quadrature and in-phase component signals from said demodulator and for outputting feedback quadrature and in-phase component signals, respectively; and a phase difference detector for detecting a phase difference between the input and feedback quadrature component signals and a phase difference between the input and feedback in-phase component signals, for separating each of the phase differences into a fixed phase quantity and a variable phase quantity smaller than the fixed phase quantity, and for outputting a signal indicative of the fixed phase quantity to said second phase shifter and a signal indicative of the variable phase quantity to said first phase shifter, wherein said first correction means corrects the input quadrature component signal with the feedback quadrature component signal, and for outputting the corrected input quadrature component signal, wherein said second correction means corrects the input in-phase component signal with the feedback in-phase component signal, and for outputting the corrected input in-phase component signal, and wherein said first phase shifter shifts the phase of the carrier from said carrier oscillator by the variable phase quantity depending on the signal indicative of the variable phase quantity and said second phase shifter shifts phases of the demodulated quadrature and in-phase component signals from said demodulator by the fixed phase quantity depending on a signal indicative of the fixed phase quantity.

10. A transmitter of a radio device according to claim 9, wherein the fixed phase quantity of the phase difference detected by said phase difference detector is $n\pi/2$, where n is 0, 1, 2 or 3, and the variable phase quantity $\Phi$ of the phase difference is in a range of $0 \leq \Phi < \pi/2$.

11. A transmitter of a radio device according to claim 10, wherein said second phase shifter selectively inverts the demodulated quadrature and in-phase component signals from said demodulator in accordance with the signal indicative of the fixed phase quantity.

* * * * *